United States Patent
Wang

(10) Patent No.: US 10,776,304 B2
(45) Date of Patent: Sep. 15, 2020

(54) FAN SPEED CONTROL VIA PCIE TOPOLOGY

(71) Applicant: QUANTA COMPUTER INC., Taoyuan (TW)

(72) Inventor: Chun-Hung Wang, Taoyuan (TW)

(73) Assignee: QUANTA COMPUTER INC., Taoyuam (TW)

( * ) Notice: Subject to any disclaimer, the term of this patent is extended or adjusted under 35 U.S.C. 154(b) by 91 days.

(21) Appl. No.: 16/138,260

(22) Filed: Sep. 21, 2018

(65) Prior Publication Data
US 2020/0097431 A1    Mar. 26, 2020

(51) Int. Cl.
| G06F 13/42 | (2006.01) |
| G05B 19/042 | (2006.01) |
| H05K 7/20 | (2006.01) |
| G06F 1/20 | (2006.01) |

(52) U.S. Cl.
CPC ....... *G06F 13/4221* (2013.01); *G05B 19/042* (2013.01); *H05K 7/20727* (2013.01); *H05K 7/20836* (2013.01); *G05B 2219/21156* (2013.01); *G06F 2213/0026* (2013.01)

(58) Field of Classification Search
CPC ........ G06F 13/4221; G06F 2213/0026; H05K 7/20836; H05K 7/20727; G05B 19/042; G05B 2219/21156
USPC ...................................................... 700/300
See application file for complete search history.

(56) References Cited

U.S. PATENT DOCUMENTS

| 2011/0273833 | A1 | 11/2011 | Zhang et al. |
| 2015/0108934 | A1* | 4/2015 | Wong ................. F04D 25/0613 318/472 |
| 2015/0212755 | A1* | 7/2015 | Asnaashari .......... G06F 3/0629 711/103 |
| 2018/0210851 | A1* | 7/2018 | Hu ........................ G06F 13/364 |

FOREIGN PATENT DOCUMENTS

| CN | 106640721 A | * | 5/2017 |
| CN | 106640721 A | | 5/2017 |
| CN | 108196999 A | | 6/2018 |
| WO | 2016037503 A1 | | 3/2016 |

OTHER PUBLICATIONS

TW Office Action for Application No. 107147587, dated Jul. 23, 2019, w/ First Office Action Summary.
Extended European Search Report for EP Application No. 19172527. 4, dated Nov. 27, 2019.

* cited by examiner

*Primary Examiner* — Jigneshkumar C Patel
(74) *Attorney, Agent, or Firm* — Nixon Peabody LLP

(57) ABSTRACT

The present disclosure provides a system and method for retrieving temperature information of GPUs of a server system via PCIe topology, and using a baseboard management controller (BMC) to control fan speed(s) of cooling fans based at least upon the temperatures of the GPUs. In some implementations, the management controller can determine a PCIe topology of the server system via an operating system (OS), and get the BusID of each GPU or GPU card of the server system. Based upon the BusID, the management controller can retrieve temperature information of a corresponding GPU from a GPU library (e.g., NVIDIA Management Library [NVML]), and further control fan speed of cooling fan(s) based at least upon the temperature information.

20 Claims, 8 Drawing Sheets

FAN SPEED CONTROL VIA PCIE TOPOLOGY

CROSS-REFERENCE TO RELATED APPLICATIONS

This application is related to Ser. No. 16/138,292, entitled "THERMAL MANAGEMENT VIA OPERATING SYSTEM", and Ser. No. 16/138,319, entitled "THERMAL MANAGEMENT VIA VIRTUAL BMC MANAGER", both of which are being filed concurrently.

FIELD OF THE INVENTION

The disclosure generally relates to temperature management in a computing system.

BACKGROUND

Modern computing systems comprise numerous electronic components such as GPUs, CPUs, RAM, etc. As electronic components become faster and more powerful (e.g., with smaller form factors and faster GPUs or CPUs), more heat is generated within the electronic components. Without adequate cooling, overheating may occur and cause physical damage to the components; and sometimes even lead to system failures and data loss.

Thus, it is important to monitor temperatures of key components (e.g., GPUs) of the systems to avoid overheating. In conventional systems, the systems can read the temperatures of GPUs through Inter-Integrated Circuit ($I^2C$) connections, and then use cooling fans to remove excessive heat from the GPUs by actively exhausting accumulated hot air, thus maintaining suitable temperatures within the GPUs.

However, in certain computing systems, GPUs do not have $I^2C$ connections to transmit temperature information.

SUMMARY

Systems and methods, in accordance with various examples of the present disclosure, provide a solution to the above-mentioned problems by retrieving temperature information of GPUs of a server system via peripheral component interconnect express (PCIe) topology, and using a management controller (e.g., baseboard management controller [BMC]) to control fan speed(s) of cooling fans based at least upon the temperatures of the GPUs. In some implementations, the management controller can determine a PCIe topology of the server system via an operating system (OS); and get BusID of each GPU or GPU card of the server system. Based upon the BusID, the management controller can retrieve temperature information of a corresponding GPU from a GPU library (e.g., NVIDIA™ Management Library [NVML]), and further control fan speed of associated cooling fan(s) based at least upon the temperature information. In some implementations, the management controller manages the fan speed of the cooling fan(s) such that a corresponding GPU can operate at a suitable temperature, and achieve an optimized utilization rate.

In some implementations, the server system uses a PCIe topology tree to identify PCIe topology within the server system, and then transmit PCIe BusID information to a BMC via an OS agent. In an event that the PCIe BusID information associates with a GPU card, the BMC can retrieve temperature information of the GPU card from the GPU library according to the PCIe BusID information. Based at least upon the temperature information of the GPU card, the BMC can control the fan speed of cooling fan(s) associated with the GPU card via in-band $I^2C$.

In an event that the PCIe BusID information associates with a PCIe switch, the BMC can use the PCIe BusID information of the PCIe switch to retrieve temperature information of GPU(s) associated with the PCIe switch from the GPU library. Based upon the temperature information of GPU(s) associated with the PCIe switch, and temperature(s) of CPU(s) of the server system, the BMC can control the fan speed of cooling fan(s) associated with the PCIe switch via in-band $I^2C$. For example, a sensor group can be disposed between the CPU(s) and the PCIe switch, and used to detect temperature(s) of the CPU(s), or temperatures between the CPU(s) and the PCIe switch. The BMC controls the fan speed of cooling fan(s) associated with the PCIe switch, based at least upon the temperature information of GPU(s) and the temperature(s) of the CPU(s).

In an event that the PCIe BusID information associates with a retimer card, the BMC can use the PCIe BusID information of the retimer card to retrieve temperature information of the GPU(s) associated with the retimer card from the GPU library. Based upon temperature information of the GPU(s) associated with the retimer, the BMC can control the fan speed of corresponding cooling fan(s) associated with the retimer card via out-band $I^2C$. For examples, a just-bunch-of-disks system can comprise a plurality of GPUs, PCIe switches, retime cards, and a plurality of cooling fans. The BMC can use the PCIe BusID information of a retimer card to retrieve temperature information of GPU(s) associated with the retimer card from the GPU library. Based upon the temperature information of GPU(s), the BMC can control the fan speed of cooling fan(s) associated with the retimer card via out-band $I^2C$ based at least upon the temperature information of GPU(s).

In accordance with one aspect of the present disclosure, a computer-implemented method for controlling fan speed via a PCIe topology of a server system, comprises: determining the PCIe topology of the server system using a PCIe topology tree; transmitting PCIe BusID information via an OS agent; in an event that the PCIe BusID information corresponds to a GPU card, retrieving temperature information of the GPU card from a GPU library L according to the PCIe BusID information; and managing fan speed of cooling fan(s) associated with the GPU card via in-band $I^2C$ based at least upon the temperature information of the GPU card. In some implementations, the computer-implemented method further comprises: in an event that the PCIe BusID information corresponds to a PCIe switch, retrieving temperature information of GPU(s) associated with the PCIe switch from the GPU library according to the PCIe BusID information; determining temperature information of CPU(s) of the server system; and managing the fan speed of cooling fan(s) associated with the PCIe switch via in-band $I^2C$ based at least upon the temperature information of GPU(s) and the temperature information of the CPU(s). In some implementations, the computer-implemented method further comprises: in an event that the PCIe BusID information corresponds to a retimer card, retrieving temperature information of GPU(s) associated with the retimer card from the GPU library according to the PCIe BusID information; and managing fan speed of cooling fan(s) associated with the retimer card via out-band $I^2C$ based at least upon the temperature information of GPU(s).

In accordance with another aspect of the present disclosure, a non-transitory computer-readable storage medium storing instructions is provided. The instructions, when executed by a processor, cause the processor to perform operations including: determining a PCIe topology of a server system using a PCIe topology tree; transmitting PCIe BusID information via an OS agent; in an event that the PCIe BusID information corresponds to a GPU card, retrieving temperature information of the GPU card from a GPU library according to the PCIe BusID information; and managing fan speed of cooling fan(s) associated with the GPU card via in-band I²C based at least upon the temperature information of the GPU card.

Additional features and advantages of the disclosure will be set forth in the description that follows, and will in part be obvious from the description; or can be learned by the practice of the principles set forth herein. The features and advantages of the disclosure can be realized and obtained by means of the instruments and combinations particularly pointed out in the appended claims.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims:

DETAILED DESCRIPTION

Figure 1A:
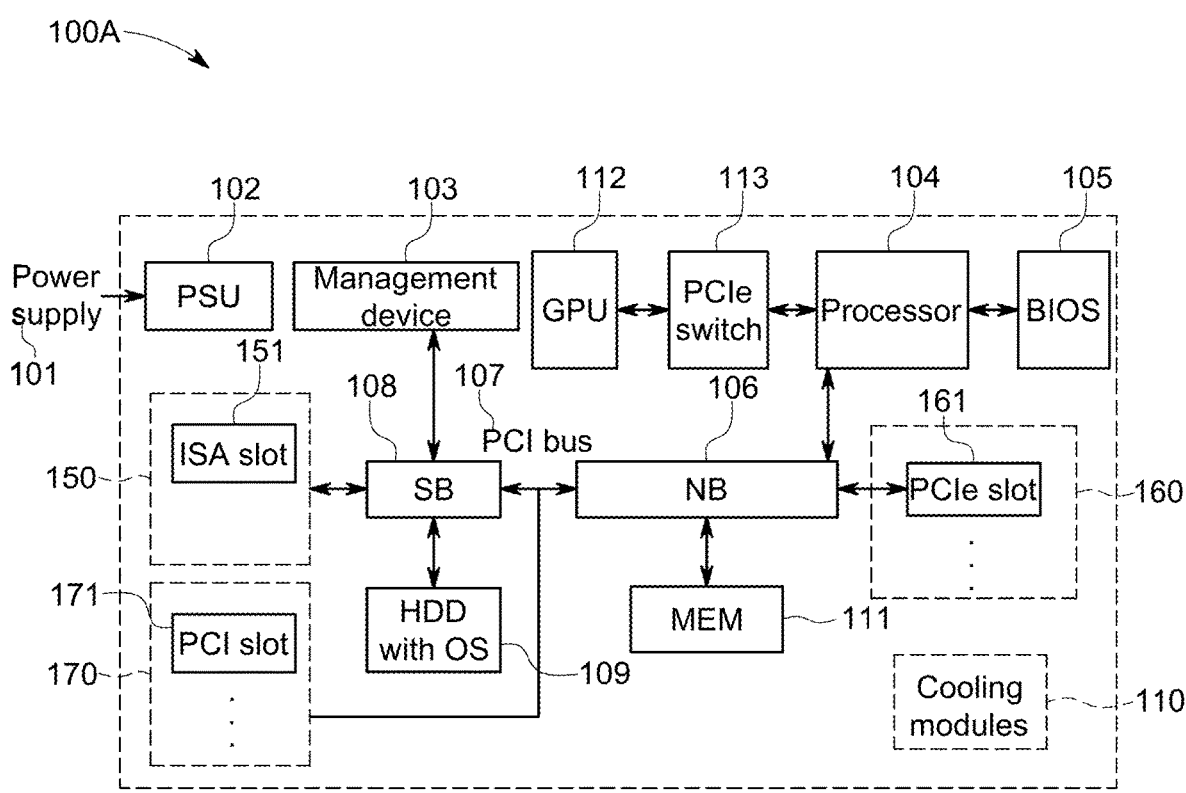
FIG. 1A is a schematic block diagram illustrating an exemplary system in a data center having GPU(s) without I²C connections to transmit temperature information, in accordance with an implementation of the present disclosure.

The present disclosure can be embodied in many different forms. Representative embodiments are shown in the drawings, and will herein be described in detail. These embodiments are examples or illustrations of the principles of the disclosure but are not intended to limit its broad aspects. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Various examples of the present disclosure provide systems and methods for retrieving temperature information of GPUs of a server system via PCIe topology, and using a baseboard management controller (BMC) to control fan speed(s) of cooling fans based at least upon the temperatures of the GPUs. In some implementations, the management controller can determine a PCIe topology of the server system via an operating system (OS), and get BusID of each GPU or GPU card of the server system. Based upon the BusID, the management controller can retrieve temperature information of a corresponding GPU from a GPU library (e.g., NVIDIA Management Library [NVML]), and further control fan speed of associated cooling fan(s) based at least upon the temperature information.

FIG. 1A is a schematic block diagram illustrating an exemplary system in a data center having GPU(s) without I²C connections to transmit temperature information, in accordance with an implementation of the present disclosure. In this example, the server system 100A includes GPU 112, processor 104, PCIe switch 113, one or more cooling modules 110, a main memory (MEM) 111, at least one power supply unit (PSU) 102 that receives an AC power from an AC power supply 101, and provide power to various components of the server system 100A, such as the processor 104, north bridge (NB) logic 106, PCIe slots 160, south bridge (SB) logic 108, storage device 109, ISA slots 150, PCI slots 170, and a management device 103. In this example, at least one GPU 112 does not have I²C connections to transmit temperature information of the corresponding GPU 112. The PCIe switch 113 enables high-speed serial point-to-point connections among multiple I/O devices, GPU 112, and processor 104 for optimized aggregation, fan-out, or peer-to-peer communication of end-point traffic to a host. In some examples, the server system 100A further comprises retimer card(s) (not shown) that connects the processor 104 and the PCIe switch 113. The retimer card(s) is a mixed-signal device that has equalization functions plus a clock data recovery (CDR) function to compensate both deterministic and random jitter, and in turn transmit a clean signal downstream.

The processor 104 can be a central processing unit (CPU) configured to execute program instructions for specific functions. For example, during a booting process, the processor 104 can access firmware data stored in the management device 103 or the flash storage device, and execute the BIOS 105 to initialize the server system 100A. After the booting process, the processor 104 can execute an operating system (OS) in order to perform and manage specific tasks for the server system 100A.

In some configurations, the processor 104 can be multi-core processors, each of which is coupled together through a CPU bus connected to the NB logic 106. In some configurations, the NB logic 106 can be integrated into the processor 104. The NB logic 106 can also be connected to a plurality of peripheral component interconnect express (PCIe) slots 160 and an SB logic 108 (optional). The plurality of PCIe slots 160 can be used for connections and buses such as PCI Express ×1, USB 2.0, SMBus, SIM card, future extension for another PCIe lane, 1.5 V and 3.3 V power, and wires to diagnostics LEDs on the server system 100A's chassis.

In system 100A, the NB logic 106 and the SB logic 108 are connected by a peripheral component interconnect (PCI) Bus 107. The SB logic 108 can couple the PCI Bus 107 to a plurality of expansion cards or ISA slots 150 (e.g., an ISA slot 151) via an expansion bus. The SB logic 108 is further coupled to the management device 103 that is connected to the at least one PSU 102. In some implementations, the management device 103 can be a baseboard management controller (BMC) or a rack management controller (RMC).

The management device 103 (e.g., BMC) can use a PCIe topology tree (not shown) to identify PCIe topology within the server system 100A, and then receive PCIe BusID information via an OS agent (not shown). In some implementations, the PCIe topology tree can be information queried from lspci. Lspci is a system utility to measure real PCIe information from hardware in the system. The order can be Root Complex→Root Port→Bridge/End Point. Lspci can show an architecture from Root Complex to End Point. In some implementations, different CPU sockets can have different own root complex. Using PCIe bus IDs and their branches can help determine physical locations of hardware in hardware topology of the server system 100A.

Based upon the PCIe BusID information, the management device 103 can retrieve temperature information of a corresponding GPU 112 from a NVIDIA Management Library (NVML) (not shown), and further control fan speed of cooling fan(s) 110 associated with the GPU 112 based at least upon the temperature information.

In an event that the PCIe BusID information associates with a GPU card 112, the management device 103 can retrieve temperature information of the GPU card 112 from the NVML according to the PCIe BusID information. Based at least upon the temperature information of the GPU card, the management device 103 can control the fan speed of cooling fan(s) 110 associated with the GPU card via in-band I²C connections. In an event that the PCIe BusID information associates with the PCIe switch 113, the management device 103 can use the PCIe BusID information of the PCIe switch 113 to retrieve temperature information of GPU(s) 112 associated with the PCIe switch from the NVML. Based upon the temperature information of GPU(s) 112 associated with the PCIe switch 113, and temperature of CPU(s) of the server system, the management device 103 can control the fan speed of cooling fan(s) 110 associated with the PCIe switch 113 via in-band I²C connections. In an event that the PCIe BusID information associates with a retimer card (not shown), the management device 103 can use the PCIe BusID information of the retimer card to retrieve temperature information of GPU(s) 112 associated with the retimer card from the NVML. Based upon temperature information of the GPU(s) 112 associated with the retimer, the management device 103 can control the fan speed of corresponding cooling fan(s) 110 associated with the retimer card via out-band I²C connections.

In some implementations, fan control service is a service of the management device 103, which is a software service provided by the management device 103. The software service can query information of GPU(s) 112. If operating system (OS) executes an OS agent embedded in OS, the OS agent sends a service code 2 bytes (e.g., 0×0A) to inform the management device 103 to start the fan control service.

Figure 1B:
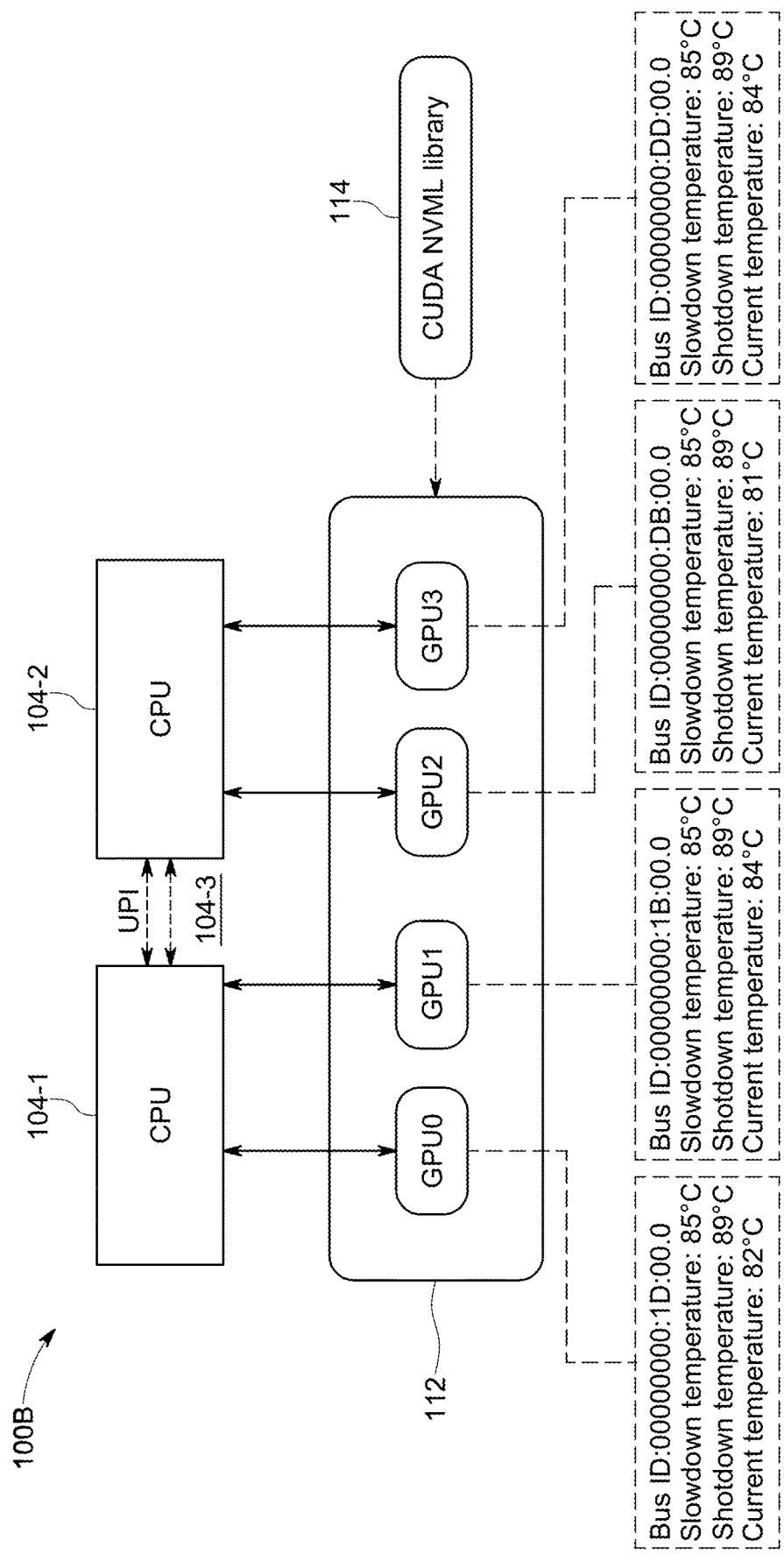
FIG. 1B is a schematic block diagram illustrating an exemplary system in FIG. 1A that includes multiple GPUs and CPUs, in accordance with an implementation of the present disclosure.

An example of the configuration in FIG. 1A is further illustrated in FIG. 1B. In FIG. 1B, the server system 100B comprises CPUs 104-1 and 104-2, and a GPU card 112 that has multiple GPUs and is connected to a NVML 114. The CPUs 104-1 and 104-2 are interconnected via UltraPath Interconnect (UPI) 104-3. At least one of the GPUs (i.e., GPU0, GPU1, GPU2 and GPU3) does not have I²C connections to transmit temperature information.

Figure 1C:
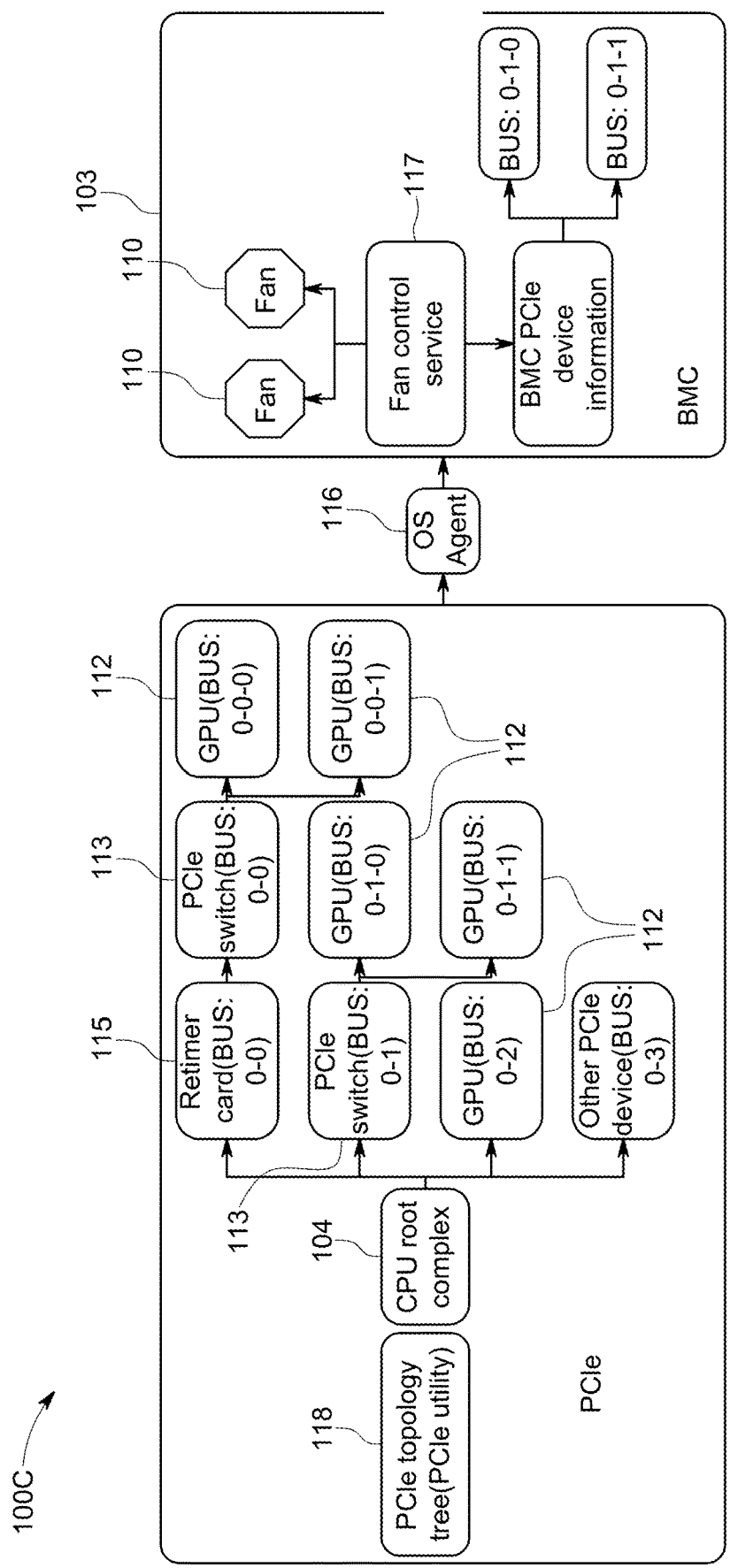
FIG. 1C is a schematic block diagram illustrating an exemplary system in FIG. 1A that controls fan speed via PCIe topology, in accordance with an implementation of the present disclosure.

An example of the fan speed control in FIG. 1A is further illustrated in FIG. 1C. In FIG. 1C, the server system 100C comprises PCIe Topology tree 118; CPU root complex 104 that connects GPU 112, PCIe switch 113, retimer card 115 and other PCIe devices; OS agent 116; and BMC 103. PCIe Topology tree 118 can identify PCIe topology within the server system 100C, and then transmit PCIe BusID information to BMC 103 via the OS agent 116. Based upon the PCIe BusID information, BMC 103 can retrieve temperature information of a corresponding GPU 112 from a library (e.g., NVIDIA Management Library [NVML] 114), and further control fan speed of associated cooling fan(s) 110 based at least upon the temperature information. In some implementations, BMC 103 may control the fan speed of cooling fan(s) 110 via a fan control service 117.

Figure 1D:
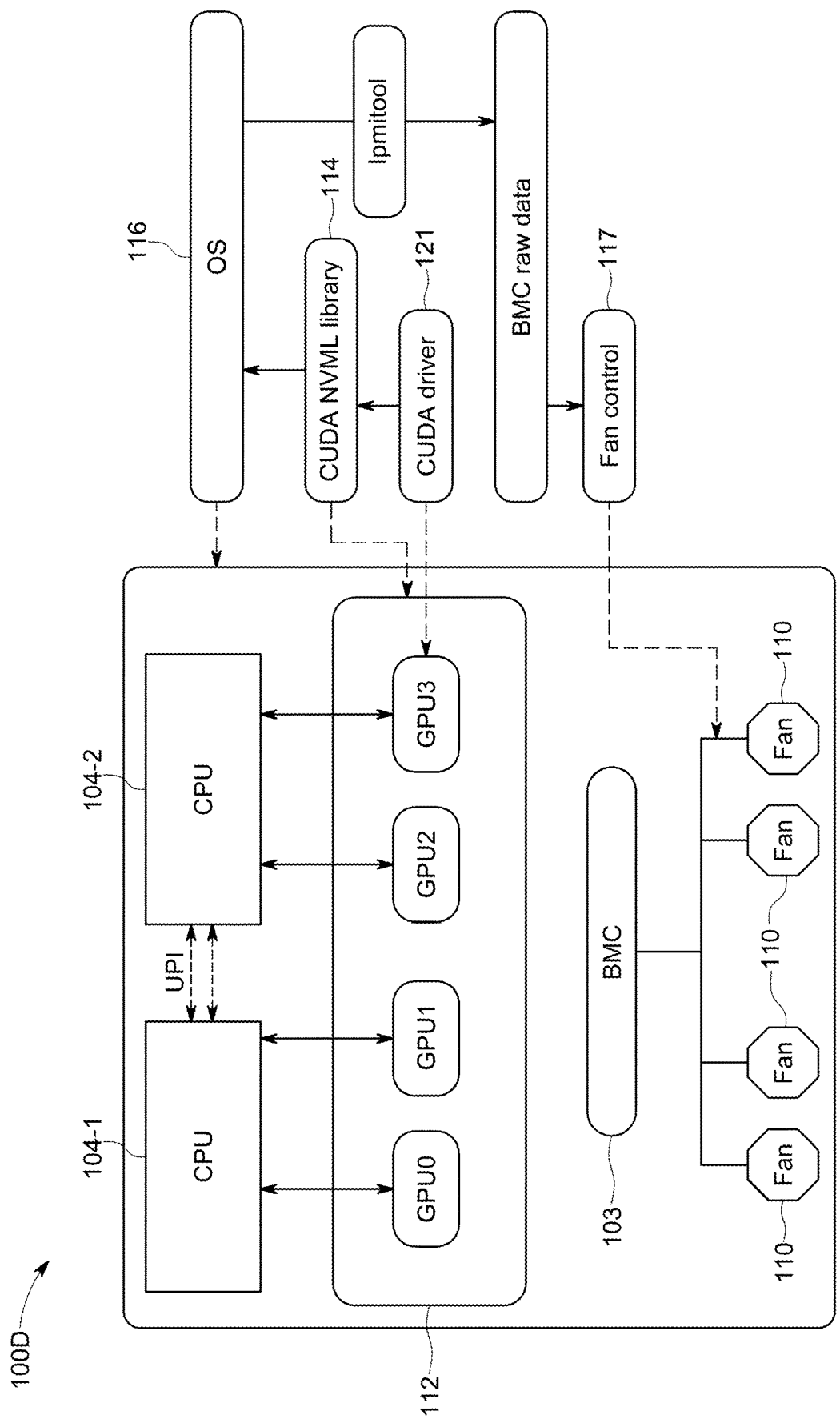
FIG. 1D is a schematic block diagram illustrating an exemplary system in FIG. 1C in which the PCIe BusID of a GPU card is transmitted to a BMC, in accordance with an implementation of the present disclosure.

FIG. 1D illustrates a scenario in FIG. 1C that PCIe BusID of a GPU card 112 is transmitted to the BMC 103. In this example, CPUs 104-1 and 104-2 are directly connected to the GPU card 112 that includes multiple GPUs. NVML 114 collects temperature information of the GPUs (e.g., GPU0, GPU1, GPU2, and GPU3) via a CUDA driver 121. BMC 103 can retrieve temperature information of the GPUs (e.g., GPU0, GPU1, GPU2, and GPU3) from the NVML 114 according to the PCIe BusID information of the GPU card 112 via OS 116. Based at least upon the temperature information of the GPUs (e.g., GPU0, GPU1, GPU2, and GPU3), the BMC 103 controls the fan speed of cooling fan(s) 110 associated with the GPU card 112 via in-band I²C connections.

Figure 1E:
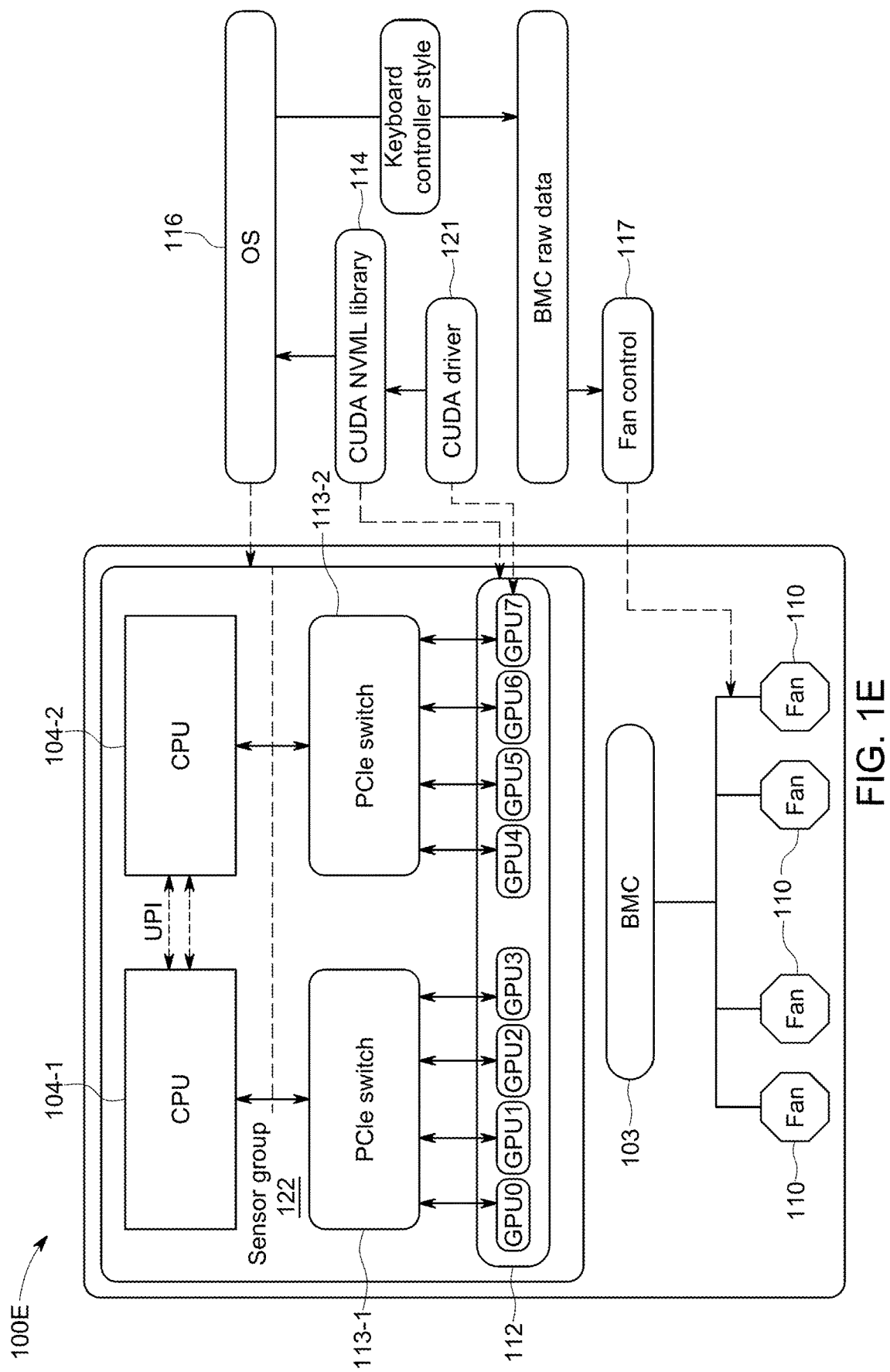
FIG. 1E is a schematic block diagram illustrating an exemplary system in FIG. 1C in which the PCIe BusID of a PCIe switch is transmitted to a BMC, in accordance with an implementation of the present disclosure.

FIG. 1E illustrates a scenario in FIG. 1C that PCIe BusIDs of PCIe switches 113-1 and 113-2 are transmitted to the BMC 103. In this example, the PCIe switch 113-1 connects CPU 104-1 and a GPU cluster including GPU0, GPU1, GPU2, and GPU3, while the PCIe switch 113-2 connects CPU 104-2 and a GPU cluster including GPU4, GPU5, GPU6, and GPU7. NVML 114 collects temperature information of the GPUs 112 via a CUDA driver 121. BMC 103 can retrieve temperature information of the GPUs (e.g., GPU0 thru GPU7) from the NVML 114 according to the PCIe BusID information of the PCIe switches 113-1 and 113-2 via OS 116. Based at least upon the temperature information of the GPUs (e.g., GPU0 thru GPU7), the BMC 103 can control the fan speed of cooling fan(s) 110 associated with the GPUs 112 via in-band I²C connections.

In some implementations, a sensor group 122 is disposed between the CPUs (i.e., 104-1 and 104-2) and the PCIe switches (i.e., 113-1 and 113-2). The sensor group is configured to detect temperatures of the CPUs (i.e., 104-1 and 104-2), or temperatures between the CPUs (i.e., 104-1 and 104-2) and the PCIe switches (i.e., 113-1 and 113-2). Based at least upon the temperatures of the CPUs (i.e., 104-1 and 104-2) and the temperature information of the GPUs (e.g., GPU0 thru GPU7), the BMC 103 can control the fan speed of cooling fan(s) 110 associated with the PCIe switches (i.e., 113-1 and 113-2) via in-band I²C connections.

In some implementations, when lspci detects the topology of the server system 100E includes a PCIe switch, the BMC 103 can automatically consider the temperatures of the CPUs (i.e., 104-1 and 104-2), and cause the fan control service 117 to collect temperature data from the sensor group 122.

In some implementations, IPMITOOL is used to call the BMC 103 by keyboard signal control (KSC) to control the BMC 103's service. BMC raw data is a space to save GPU information retrieved from the GPUs (e.g., GPU0 thru GPU7). When the OS 116 causes the BMC 103 to boot up the BMC service, the fan control service 117 can automatically load the GPU information from the BMC raw data.

Figure 1F:
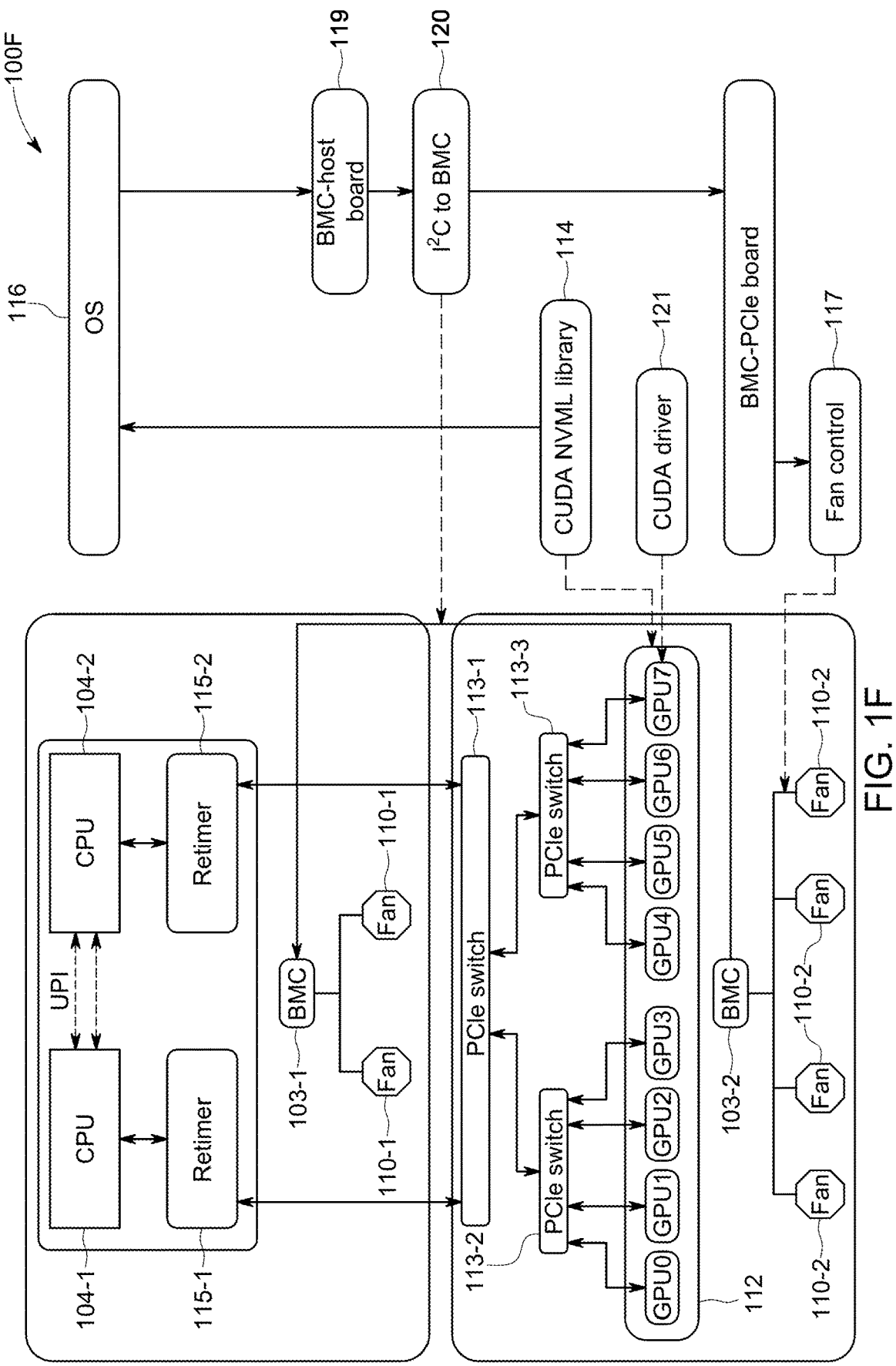
FIG. 1F is a schematic block diagram illustrating an exemplary system in FIG. 1C in which the PCIe BusID of a retimer card is transmitted to a BMC, in accordance with an implementation of the present disclosure.

FIG. 1F illustrates a scenario in FIG. 1C in which PCIe BusIDs of retimer cards 115-1 and 115-2 are transmitted to the BMC 103-1. In this example, the retimer cards 115-1 connects CPU 104-1 and the PCIe switch 113-1, while the retimer cards 115-2 connect CPU 104-2 and the PCIe switch 113-1. The PCIe switch 113-1 connects a PCIe switch 103-2 that is coupled to GPU0, GPU1, GPU2 and GPU3; and a PCIe switch 103-3 that is coupled to GPU4, GPU5, GPU6 and GPU7. NVML 114 collects temperature information of the GPUs 112 via a CUDA driver 121.

In this example, BMC 103-1 can retrieve temperature information of the GPUs (e.g., GPU0 thru GPU7) from the NVML 114 according to the PCIe BusID information of retimer cards 115-1 and 115-2 via OS 116. Based at least upon the temperature information of the GPUs (e.g., GPU0 thru GPU7), the BMC 103-1 can control the fan speed of cooling fan(s) 110-2 associated with the GPUs (e.g., GPU0 thru GPU7) via out-band I$^2$C connections 120.

In some implementations, out-band is used to connect the retimer cards 115-1 and 115-2 to a just-bunch-of-disks (JBOD) system (lower left portion of FIG. 1F). The JBOD system does not need any CPU and can only have a mini-Serial AT Attachment (SATA) to communicate with the retimer cards 115-1 and 115-2.

In this example, upper left portion and lower left portion are two separate systems with the retimer cards 115-1 and 115-2 to connect with each other. When the OS agent 116 check the topology to identify the PCIe topology of the server system 100F, it can determine that some information is not available from local components, and automatically consider information of the BMC 103-2 of the JBOD system, which includes temperature information of the GPUs (e.g., GPU0 thru GPU7). In addition, the OS agent 116 will use KSC to enable the fan control server 117, which is an isolated program from the BMC 103-2 and the BMC 103-1.

Figure 1G:
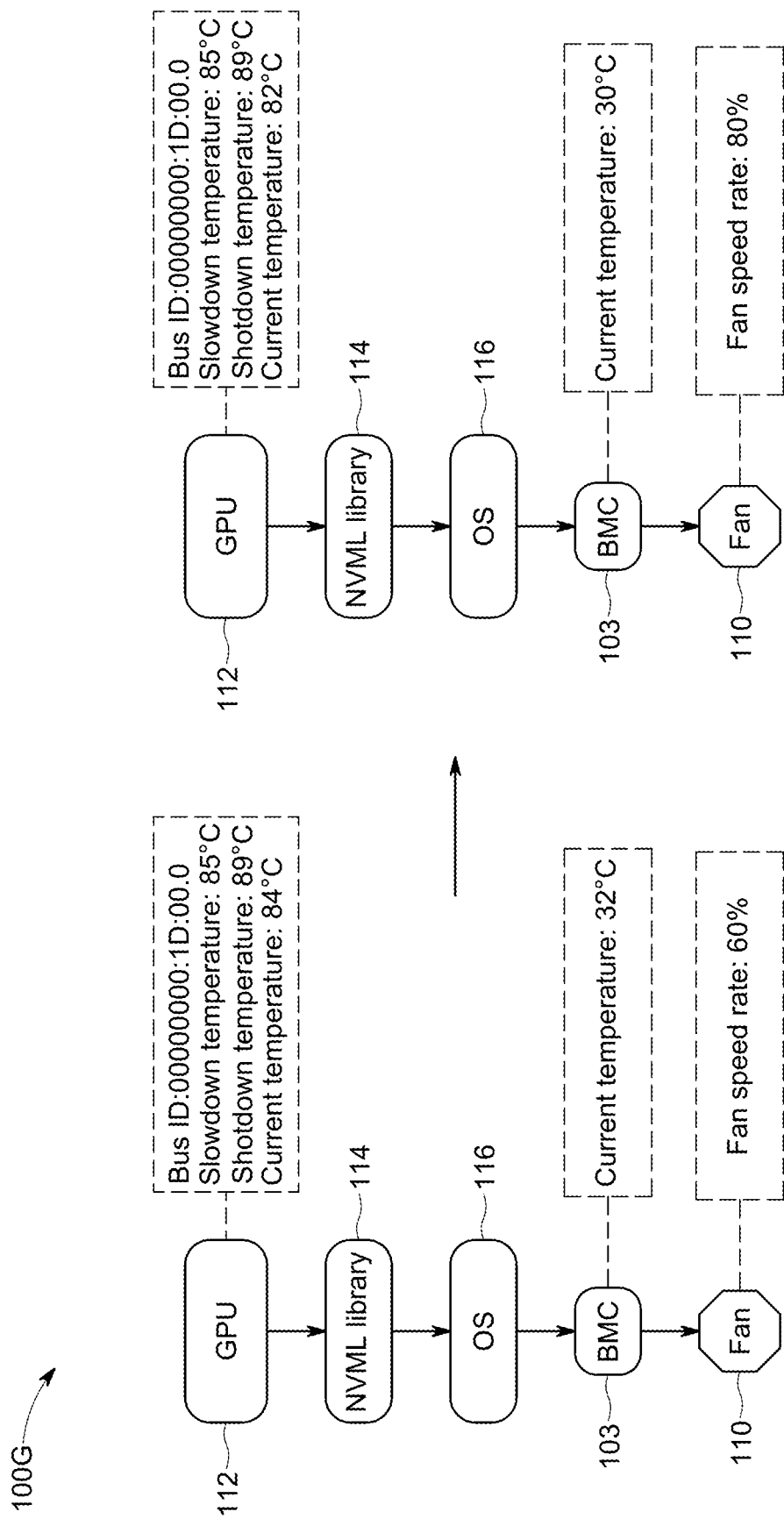
FIG. 1G is a schematic block diagram illustrating an exemplary system in FIG. 1A that effectively controls GPU temperature without requesting GPU to transmit temperature information via I²C connections, in accordance with an implementation of the present disclosure.

As illustrated above, the server systems 100A-100F can effectively control GPU temperature without requesting GPU(s) 112 to transmit temperature information via I$^2$C connections. A specific example is illustrated in FIG. 1G. In this example, GPU temperature and BMC temperature reaches 84° C. and 32° C., respectively, while fan speed rate of the cooling fans 110 is at 60%. Once BMC 103 retrieves GPU temperature, BMC 103 can determine that GPU temperature 84° C. is too close to a slowdown temperature, which is 85° C. BMC 103 can then increase the fan speed rate of cooling fans 110 from 60% to 80%. As a result, the GPU temperature and the BMC temperature reduce to 82° C. and 30° C., respectively. Thus, GPU 112 can effectively operate at a suitable temperature, and maintain a high utilization rate.

The above discussion is meant to be illustrative of the principles and various examples of the present disclosure. Numerous variations and modifications will become apparent once the above disclosure is fully appreciated.

Figure 2:
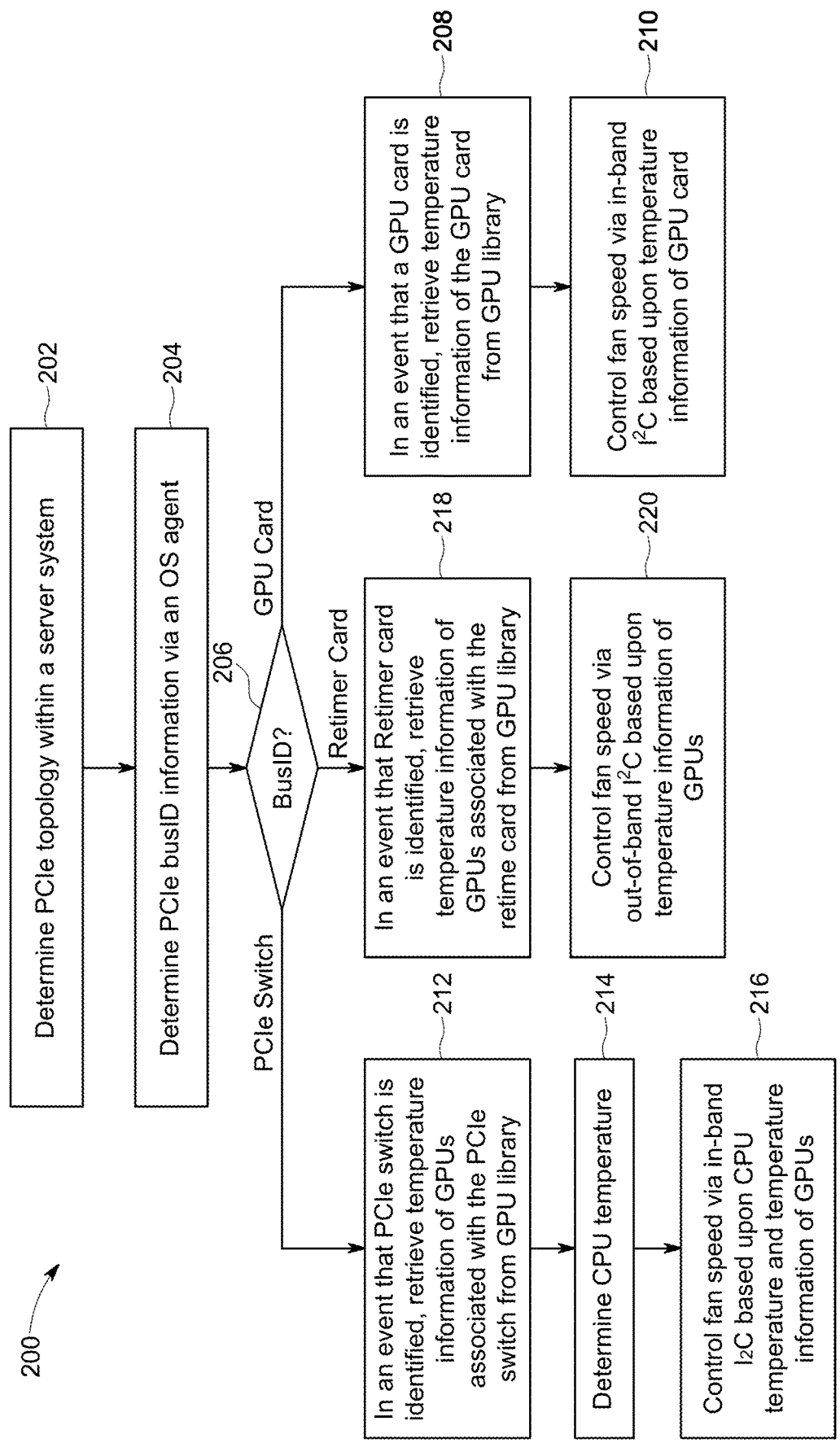
FIG. 2 is an exemplary method for controlling fan speed via a PCIe topology of a server system, in accordance with an implementation of the present disclosure.

FIG. 2 is an exemplary method 200 for controlling fan speed via a PCIe topology of a server system, in accordance with an implementation of the present disclosure. It should be understood that the exemplary method 200 is presented solely for illustrative purposes, and that other methods in accordance with the present disclosure can include additional, fewer, or alternative steps performed in similar or alternative orders, or in parallel. The exemplary method 200 starts at step 202 by determining the PCIe topology of the server system. In some implementations, a PCIe topology tree in the server system can be used to determine the PCIe topology of the server system.

At step 204, PCIe BusID information can be transmitted to a management controller (e.g., BMC) of the server system via an OS agent, as illustrated in FIGS. 1A-1F. In some implementations, the PCIe topology tree transmits the PCIe BusID information to the management controller via the OS agent. The management controller can identify a specific device associated with received PCIe BusID information, at step 206.

In an event that the PCIe BusID information corresponds to a GPU card, the management controller can retrieve temperature information of the GPU card from a GPU library (e.g., NVIDIA Management Library [NVML]) according to the PCIe BusID information at step 208, as illustrated in FIGS. 1C and 1D. Based at least upon the temperature information of the GPU card, the management controller can control the fan speed of cooling fan(s) associated with the GPU card via in-band I$^2$C connections, at step 210.

In an event that the PCIe BusID information corresponds to a PCIe switch, the management controller can retrieve temperature information of GPUs associated with the PCIe card from GPU library, according to the PCIe BusID information at step 212, as illustrated in FIGS. 1C and 1E. In some implementations, a sensor group can be disposed between the CPU(s) and the PCIe switch, and used to detect temperatures of the CPU(s) or temperatures between the CPU(s) and the PCIe switch, as illustrated in FIG. 1E. The management controller can determine CPU temperature using the sensor group, at step 214. Based at least upon the temperature information of GPU(s) and the temperature(s) of the CPU(s), the management controller can control the fan speed of cooling fan(s) associated with the PCIe switch via in-band I$^2$C connections, at step 216.

In an event that the PCIe BusID information corresponds to a retimer card, the management controller can retrieve temperature information of GPUs associated with the retimer card from GPU library according to the PCIe BusID information, at step 218, as illustrated in FIGS. 1C and 1F. Based at least upon the temperature information of GPU(s), the management controller can control the fan speed of cooling fan(s) associated with the retimer card via out-band I$^2$C connections, at step 220.

What is claimed is:

1. A computer-implemented method for controlling fan speed of cooling fans of a server system via a peripheral component interconnect express (PCIe) topology, comprising:

determining the PCIe topology of the server system comprising PCIe BusID information;

transmitting the PCIe BusID information via an operating system (OS) agent;

determining that the PCIe BusID information corresponds to at least one GPU card in addition to at least one selected from the group consisting of a central processing unit (CPU), a retimer card and a PCIe switch, retrieving temperature information of the at least one GPU card from a GPU library according to the PCIe BusID information; and managing fan speed of cooling fans associated with the server comprising the at least one GPU card, and the at least one selected from the group consisting of a CPU, a retimer card and a PCIe switch, by obtaining the temperature of the at least one GPU card, from at least one temperature selected from the group consisting of the CPU, the retimer card and the PCIe switch, and without requesting the at least one GPU card to transmit temperature information via in-band Inter-Integrated Circuit ($I^2C$) connections, and adjusting the fan speed of cooling fans by comparing the obtained temperature of the at least one GPU card to at least the temperature information of the at least one GPU card obtained from the GPU library.

2. The computer-implemented method of claim 1, further comprising:

determining that the PCIe BusID information corresponds to a PCIe switch, wherein the at least one GPU card comprises at least two GPU(s) associated with the PCIe switch, retrieving temperature information of the at least two GPU(s) from the GPU library according to the PCIe BusID information; and managing the fan speed of cooling fans associated with the PCIe switch via in-band $I^2C$ connections based at least upon the temperature information of the GPU(s).

3. The computer-implemented method of claim 2, comprising:

wherein the at least one CPU comprises at least two CPU(s) of the server system; determining temperature information of the CPU(s); and managing the fan speed of cooling fans associated with the PCIe switch via in-band $I^2C$ connections based at least upon the temperature information of the GPU(s) and the temperature information of the CPU(s).

4. The computer-implemented method of claim 3, wherein the temperature information of CPU(s) is collected by a sensor group disposed between the CPU(s) and PCIe switch.

5. The computer-implemented method of claim 1, comprising:

determining that the PCIe BusID information corresponds to a retimer card, retrieving temperature information of at the least one GPU associated with the retimer card from the GPU library according to the PCIe BusID information; and managing fan speed of cooling fans associated with the retimer card via out-band $I^2C$ connections based upon the temperature information of the at least one GPU.

6. The computer-implemented method of claim 1, wherein the PCIe topology of the server system is determined using a PCIe topology tree, and wherein the PCIe topology tree transmits the PCIe BusID information to the management controller via the OS agent.

7. The computer-implemented method of claim 1, wherein the management controller is a baseboard management controller (BMC).

8. A server system, comprising:
a processor;
a management controller; and
a computer-readable medium storing instructions that, when executed by he processor, cause the server system to perform operations comprising:

determining a peripheral component interconnect express (PCIe) topology of the server system comprising PCIe BusID information;

transmitting the PCIe BusID information via an operating system (OS) agent;

determining that the PCIe BusID information corresponds to at least one GPU card, in addition to at least one selected from the group consisting of a central processing unit (CPU), a retimer card and a PCIe switch;

retrieving temperature information of the at least one GPU card from a GPU library according to the PCIe BusID information; and managing fan speed of cooling fans associated with the server comprising the at least one GPU card, and the at least one selected from the group consisting of a CPU, a retimer card and a PCIe switch, by obtaining the temperature of the at least one GPU card, from at least one temperature selected from the group consisting of the CPU, the retimer card and the PCIe switch, and without requesting the at least one GPU card to transmit temperature information via in-band Inter-Integrated Circuit ($I^2C$) connections, and adjusting the fan speed of cooling fans by comparing the obtained temperature of the at least one GPU card to at least upon the temperature information of the at least one GPU card obtained from the GPU library.

9. The server system of claim 8, wherein the computer-readable medium storing instructions that, when executed by the processor, further cause the server system to perform operations comprising:

determining that the PCIe BusID information corresponds to a PCIe switch, wherein the at least one GPU comprises at least two GPU(s), at least one GPU associated with the PCIe switch, retrieving temperature information of the GPU(s) associated with the PCIe switch from the GPU library according to the PCIe BusID information; and managing the fan speed of cooling fans associated with the PCIe switch via in-band $I^2C$ connections based at least upon the temperature information of the GPU(s).

10. The server system of claim 9, wherein the computer-readable medium storing instructions that, when executed by the processor, further cause the server system to perform operations comprising:

wherein the at least one CPU comprises at least two CPU(s) of the server system; determining temperature information of the CPU(s); and managing the fan speed of cooling fans associated with the PCIe switch via in-band $I^2C$ connections based at least upon the temperature information of the at least two GPU(s) and the temperature information of the CPU(s).

11. The server system of claim 10, wherein the temperature information of CPU(s) is collected by a sensor group disposed between the CPU(s) and PCIe switch.

12. The server system of claim 8, wherein the computer-readable medium storing instructions that, when executed by the processor, further cause the server system to perform operations comprising:

determining that the PCIe BusID information corresponds to a retimer card, retrieving temperature information of the at least one GPU associated with the retimer card from the GPU library according to the PCIe BusID information; and managing fan speed of cooling fans associated with the retimer card via out-band $I^2C$ connections based upon the temperature information of the at least one GPU.

13. The server system of claim 8, wherein the PCIe topology of the server system is determined using a PCIe topology tree, and wherein the PCIe topology tree transmits the PCIe BusID information to the management controller via the OS agent.

14. The server system of claim 8, wherein the management controller is a baseboard management controller (BMC).

15. A non-transitory computer-readable storage medium including instructions that, when executed by at least one processor of a server system, cause the server system to perform operations comprising:
  determining a peripheral component interconnect express (PCIe) topology of the server system comprising PCIe BusID information;
  transmitting the PCIe BusID information via an operating system (OS) agent;
  determining that the PCIe BusID information corresponds to at least one GPU card, in addition to at least one selected from the group consisting of a central processing unit (CPU), a retimer card and a PCIe switch;
  retrieving temperature information of the at least one GPU card from a GPU library according to the PCIe BusID information; and
  managing fan speed of cooling fans associated with the server comprising the at least one GPU card, and the at least one selected from the group consisting of a CPU, a retimer card and a PCIe switch, by obtaining the temperature of the at least one GPU card, from at least one temperature selected from the group consisting of the CPU, the retimer card and the PCIe switch, and without requesting the at least one GPU card to transmit temperature information via in-band Inter-Integrated Circuit (I²C) connections, and adjusting the fan speed of cooling fans by comparing the obtained temperature of the at least one GPU card to at least upon the temperature information of the at least one GPU card obtained from the GPU library.

16. The non-transitory computer-readable storage medium of claim 15, wherein the instructions, when executed by at least one processor of a server system, further cause the server system to perform operations comprising:
  determining that the PCIe BusID information corresponds to a PCIe switch, wherein the at least one GPU comprises at least two GPU(s), at least one GPU associated with the PCIe switch, retrieving temperature information of the GPU(s) associated with the PCIe switch from the GPU library according to the PCIe BusID information; and
  managing the fan speed of cooling fans associated with the PCIe switch via in-band I²C connections based at least upon the temperature information of the GPU(s).

17. The non-transitory computer-readable storage medium of claim 16, wherein the instructions, when executed by at least one processor of a server system, further cause the server system to perform operations comprising:
  wherein the at least one CPU comprises at least two CPU(s) of the server system;
  determining temperature information of the CPU(s); and
  managing the fan speed of cooling fans associated with the PCIe switch via in-band I²C connections based at least upon the temperature information of the GPU(s) and the temperature information of the CPU(s).

18. The non-transitory computer-readable storage medium of claim 17, wherein the temperature information of CPU(s) is collected by a sensor group disposed between the CPU(s) and PCIe switch.

19. The non-transitory computer-readable storage medium of claim 15, wherein the instructions, when executed by at least one processor of a server system, further cause the server system to perform operations comprising:
  determining that the PCIe BusID information corresponds to a retimer card, retrieving temperature information of GPU(s) associated with the retimer card from the GPU library according to the PCIe BusID information; and
  managing fan speed of cooling fans associated with the retimer card via out-band I²C connections based upon the temperature information of the at least one GPU.

20. The non-transitory computer-readable storage medium of claim 15, wherein the PCIe topology of the server system is determined using a PCIe topology tree, and wherein the PCIe topology tree transmits the PCIe BusID information to the management controller via the OS agent.

* * * * *